United States Patent
Choi et al.

(10) Patent No.: US 9,647,166 B2
(45) Date of Patent: May 9, 2017

(54) ELECTRONIC DEVICE INCLUDING LATERALLY ARRANGED P-TYPE AND N-TYPE REGIONS IN A TWO DIMENSIONAL (2D) MATERIAL LAYER AND METHOD OF MANUFACTURING THE SAME

(71) Applicant: Samsung Electronics Co., Ltd., Suwon-Si, Gyeonggi-Do (KR)

(72) Inventors: Minsup Choi, Suwon-si (KR); Wonjong Yoo, Suwon-si (KR); Deshun Qu, Suwon-si (KR); Changho Ra, Suwon-si (KR); Xiaochi Liu, Suwon-si (KR); Seunghwan Lee, Suwon-si (KR); Jia Lee, Suwon-si (KR)

(73) Assignees: Samsung Electronics Co., Ltd., Gyeonggi-do (KR); Research & Business Foundation Sungyunkwan University, Gyeonggi-do (KR)

( * ) Notice: Subject to any disclaimer, the term of this patent is extended or adjusted under 35 U.S.C. 154(b) by 0 days.

(21) Appl. No.: 14/554,363

(22) Filed: Nov. 26, 2014

(65) Prior Publication Data

US 2015/0340522 A1    Nov. 26, 2015

(30) Foreign Application Priority Data

May 21, 2014    (KR) .................. 10-2014-0061167

(51) Int. Cl.
*H01L 31/054*    (2014.01)
*H01L 29/06*    (2006.01)
(Continued)

(52) U.S. Cl.
CPC ...... *H01L 31/18* (2013.01); *H01L 31/022425* (2013.01); *H01L 31/032* (2013.01); *H01L 31/054* (2014.12); *Y02E 10/52* (2013.01)

(58) Field of Classification Search
CPC ....... H01L 29/12; H01L 29/786; H01L 29/66; H01L 29/0665; H01L 29/24;
(Continued)

(56) References Cited

U.S. PATENT DOCUMENTS 9,368,667 B1 *    6/2016    Kim .................... H01L 31/1136
9,472,396 B2 *    10/2016    Khondaker ....... H01L 21/02175
(Continued)

OTHER PUBLICATIONS

J. Lin et al. "Plasmonic enhancement of photocurrent in MoS2 field-effect-transistor", Applied Physics Letters, 102, 203109, 2013.*

(Continued)

*Primary Examiner* — Marc Armand
*Assistant Examiner* — Younes Boulghassoul
(74) *Attorney, Agent, or Firm* — Harness, Dickey & Pierce, P.L.C.

(57) ABSTRACT

According to example embodiments, an electronic device includes a substrate, an insulating layer on the substrate, and a diode layer on the insulating layer. The diode layer includes a two dimensional (2D) material layer. The 2D material layer includes an N-type region and a P-type region. According to example embodiments, a method of manufacturing an electronic device includes forming an insulating film on a substrate, forming a 2D material layer on the insulating film, and dividing the 2D material layer into an N-type region and a P-type region.

17 Claims, 6 Drawing Sheets

(51) Int. Cl.
*H01L 31/032* (2006.01)
*H01L 31/18* (2006.01)
*H01L 31/0224* (2006.01)

(58) Field of Classification Search
CPC . H01L 29/737; H01L 29/66977; H01L 29/78; H01L 31/022408; H01L 31/0216; H01L 31/02161; H01L 31/0224; H01L 31/022425; H01L 31/0232; H01L 31/02327; H01L 31/18; H01L 31/054; H01L 31/032; H01L 31/035281; H01L 31/109; H01L 21/36; Y02E 10/52
USPC .................................... 257/211, 29; 438/478
See application file for complete search history.

(56) References Cited

U.S. PATENT DOCUMENTS

| | | | |
|---|---|---|---|
| 2011/0003451 A1* | 1/2011 | Orlowski | H01L 29/42392 438/285 |
| 2011/0089404 A1* | 4/2011 | Marcus | B82Y 30/00 257/29 |
| 2013/0000690 A1 | 1/2013 | Liu | |
| 2013/0105824 A1* | 5/2013 | Paranjape | H01L 31/032 257/86 |
| 2013/0168640 A1* | 7/2013 | Yun | H03K 19/20 257/29 |
| 2014/0197459 A1* | 7/2014 | Kis | H01L 29/66742 257/194 |
| 2015/0137075 A1* | 5/2015 | Heo | H01L 27/0922 257/29 |
| 2016/0126317 A1* | 5/2016 | Kim | H01L 29/1606 257/29 |

OTHER PUBLICATIONS

K. Watanabe et al. "Direct-bandgap properties and evidence for ultraviolet lasing of hexagonal boron nitride single crystal", Nature Materials, vol. 3, pp. 404-409, 2004.*
Greim et al. "Boron Carbide, Boron Nitride, and Metal Borides", Ullmann's Encyclopedia of Industrial Chemistry, vol. 6, pp. 219-236, 2012.*
T.S. Sreeprasad et al, "Controlled, Defect-Guided, Metal-Nanoparticle Incorporation onto $MoS_2$, via Chemical and Microwave Routes: Electrical, Thermal, and Structural Properties", Aug. 8, 2013, Nano Letters pp. 4434-4441.
Hongsuk Nam et al. "$Mos_2$ Transistors Fabricated via Plasma-Assisted Nanoprinting of Few-Layer $Mos_2$ Flakes into Large-Area Arrays", 2013, vol. 7, No. 7 pp. 5870-5881.
Mikai Chen et al. "Stable few-layer $MoS_2$ rectifying diodes formed by plasma-assisted doping", Applied Physics Letters 103, 2013.
Woong Choi et al. "High-Detectivity Multilayer $MoS_2$ Phototransistors with Spectral Response from Ultraviolet to Infrared", Advanced Materials 2012.
M. S. Choi, et al. "Controlled charge trapping by molybdenum disulphide and graphene in ultrathin heterostructured memory devices"; Nature Communications, vol. 4, Article 1624, pp. 1-7; 2013.
Y. Shi, et al. "Selective Decoration of Au Nanoparticles on Monolayer MoS2 Single Crystals"; Scientific Reports, vol. 3, Article 1839, pp. 1-7; 2013.
Z. Yin, et al. "Single Layer MoS2 Phototransistors"; ACS Nano, vol. 6, Issue 1 pp. 74-80; 2012.
B. Radisavljevic, et al. "Single layer MoS2 transistors"; Nature Nanotechnology, vol. 6, pp. 147-150; 2011.
Zhang, et al. "Formation of a Stable p-n Junction in a Liquid-Gated MoS2 Ambipolar Transistor", Nano Letters, vol. 13, pp. 3023-3028 (2013).

* cited by examiner

ELECTRONIC DEVICE INCLUDING LATERALLY ARRANGED P-TYPE AND N-TYPE REGIONS IN A TWO DIMENSIONAL (2D) MATERIAL LAYER AND METHOD OF MANUFACTURING THE SAME

RELATED APPLICATION

This application claims the benefit of Korean Patent Application No. 10-2014-0061167, filed on May 21, 2014, in the Korean Intellectual Property Office, the disclosure of which is incorporated herein in its entirety by reference.

BACKGROUND

1. Field

The present disclosure relates to electronic devices, and more particularly, to electronic devices that include a horizontal diode that uses a two dimensional (2D) material and/or methods of forming the same.

2. Description of the Related Art

Molybdenite ($MoS_2$) is a semiconductor material having a band gap (a single layer has 1.9 eV, and a multiple layer has 1.2 eV) similar to that of silicon. Due to the high mobility and on/off ratio of molybdenite, molybdenite has drawn attention as a substitute for silicon in silicon based electronic devices. A single $MoS_2$ layer has a direct bandgap, and is well known for being applicable to optical devices due to its energy gap in a visible light region. Furthermore, not only the single layer $MoS_2$ but also multilayer $MoS_2$ has a high light absorption characteristic due to a Van Hove singularity. Thus, active research has been conducted into the applicability of the multilayer $MoS_2$ to optical devices having a high efficiency. $MoS_2$ is a 2D material, and may readily form a hetero-structure by being stacked with various 2D materials.

SUMMARY

Provided are electronic devices that include a horizontal type diode by using a two dimensional (2D) material.

Provided are methods of manufacturing the electronic devices.

Additional aspects will be set forth in part in the description which follows and, in part, will be apparent from the description, or may be learned by practice of example embodiments.

According to example embodiments, in an electronic device, a TMDC layer (a two dimensional (2D) material that shows a semiconductor characteristic) that includes an N-type region and a P-type region is formed on a substrate, and fine particles that increase photoelectric efficiency are distributed on the P-type region of the TMDC layer.

According to example embodiments, an electronic device may include an insulating film on a substrate and a diode layer on the insulating film. The diode layer includes a two dimensional (2D) material layer. The 2D material layer includes an N-type region and a P-type region that are horizontally disposed.

In example embodiments, a mask layer may cover the N-type region.

In example embodiments, the mask layer may be a 2D material, and the 2D material may include a hexagonal-boron nitride (h-BN) layer or a mica layer.

In example embodiments, particles may be formed on the P-type region.

In example embodiments, the particles may include fine metal particles that are configured to act as a plasmonic nanostructure.

In example embodiments, the diode layer may include a transition metal dichalcogenide (TMDC) layer.

According to example embodiments, a method of manufacturing an electronic device includes: forming an insulating film on a substrate; forming a 2D material layer on the insulating film; and dividing the 2D material layer into an N-type region and a P-type region.

In example embodiments, the 2D material layer may include a TMDC layer.

In example embodiments, the dividing the 2D material layer into the N-type region and the P-type region may include: forming first and second electrodes on the 2D material layer, the first and second electrodes being separated from each other; and transforming a portion of the 2D material layer between the first and second electrodes into the P-type region.

In example embodiments, the transforming the portion of the 2D material layer into the P-type region may include: covering a region corresponding to the N-type region of the 2D material layer with a mask layer; and covering a region corresponding to the P-type region of the 2D material layer with a sol-gel layer.

In example embodiments, the covering the region corresponding to the P-type region with the sol-gel layer may include: coating the sol-gel layer on the 2D material layer to cover the first electrode, second electrode, and mask layer on the 2D material layer; and removing the sol-gel layer from the region of the 2D material layer except for a portion of the sol-gel layer covering the region corresponding to the P-type region.

In example embodiments, the mask layer may include a different 2D material, and the different 2D material may be a non-conductive material layer having a band gap of 5 eV or more.

In example embodiments, the mask layer may include an h-BN layer or a mica layer.

In example embodiments, the sol-gel layer may include a component that combines electrons in the 2D material layer. The component may include Au.

According to example embodiments, a method of manufacturing an electronic device includes: forming an insulating film on a substrate; forming a 2D material layer on the insulating film, the 2D material layer having an N-type characteristic; and forming a P-type region in a part the 2D material layer, a remaining part of the 2D material layer an N-type region.

In example embodiments, the forming the P-type region may include forming first and second electrodes on the 2D material layer, the first and second electrode being separated from each other; and transforming a portion of the 2D material layer between the first and second electrodes into the P-type region.

BRIEF DESCRIPTION OF THE DRAWINGS

These and/or other aspects will become apparent and more readily appreciated from the following description of non-limiting embodiments, taken in conjunction with the accompanying drawings in which.

DETAILED DESCRIPTION

Hereinafter, an electronic device that includes a horizontal type diode that uses a two dimensional (2D) material according to example embodiments and a method of manufacturing the electronic device will be described in detail with reference to the accompanying drawings. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

First, an electronic device that includes a horizontal type diode that uses a 2D material according to example embodiments will be described.

Figure 1:
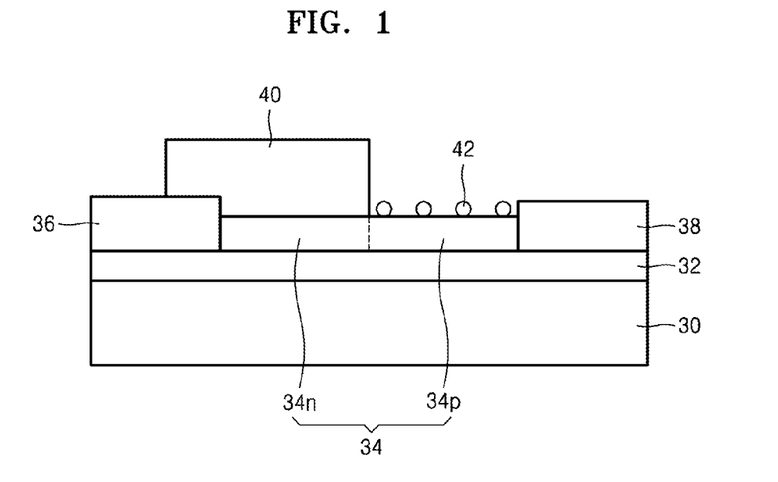
FIG. 1 is a cross-sectional view of an electronic device that includes a horizontal type diode according to example embodiments.

Referring to FIG. 1, an insulating film 32 is formed on a substrate 30. The substrate 30 may be flexible. The substrate 30 may be, for example, a silicon substrate, but not limited thereto. The insulating film 32 may be a silicon oxide ($SiO_2$) film, but is not limited thereto. That is, the insulating film 32 may be another oxide film, for example, $TiO_2$, $MnO_2$, $V_2O_5$, $TaO_3$, or $RuO_2$.

A transition metal dichalcogenide (TMDC) layer as a 2D material that shows a semiconductor characteristic and first and second electrodes 36 and 38 are formed on the insulating film 32. The TMDC layer 34 is formed between the first and second electrodes 36 and 38. The TMDC layer 34 contacts the first and second electrodes 36 and 38. Each of the first and second electrodes 36 and 38 may contact on both edges of the TMDC layer 34. Also, the first and second electrodes 36 and 38 may be formed on the TMDC layer 34, that is, an edge of the TMDC layer 34 may be disposed below the first electrode 36 and titanium Ti may be disposed below the second electrode 38. The first and second electrodes 36 and 38 may be, for example, a Pd electrode and an Au/Ti electrode. The first and second electrodes 36 and 38 may be formed of different materials.

The TMDC layer 34 may be an $MX_2$ layer as a 2D material layer. Here, M may be, for example, molybdenum Mo, tungsten W, or zirconium Zr. Also, X may be, for example, S, Se, or Te. The TMDC layer 34 may have a semiconductor characteristic. A portion of the TMDC layer 34 may be an N-type region 34n that shows an N-type doping characteristic and the remaining region of the TMDC layer 34 may be a P-type region 34p that shows a P-type doping characteristic. Accordingly, the TMDC layer 34 may be a layer showing a diode characteristic.

The N-type region 34n is an inherent characteristic region of the TMDC layer 34 and contacts the first electrode 36. The P-type region 34p may be a region showing a P-type doping characteristic by an external effect and contacts the second electrode 38. Upper surfaces of the first and second electrodes 36 and 38 may be higher than that of the TMDC layer 34.

The N-type region 34n of the TMDC layer 34 is covered by a mask layer 40. The mask layer 40 may contact the N-type region 34n. The mask layer 40 may cover a portion of the first electrode 36. The mask layer 40 may have a band gap greater than 5 eV, and prevents a material related to the formation of the P-type region 34p from penetrating into the TMDC layer 34. The mask layer 40 may have a thickness of, for example, 20 nm or less. The mask layer 40 may be a dielectric material layer that is a 2D material. For example, the mask layer 40 may be a hexagonal-boron nitride (h-BN) layer or a mica layer, but is not limited thereto.

Fine particles 42 are distributed on a P-type region 34p of the TMDC layer 34. The fine particles 42 may be fine metal particles, for example, Au particles. The fine particles 42 act as a plasmonic nanostructure. Accordingly, when external light (for example, light that exhibits a photoelectric conversion effect, such as sunlight or laser light) is irradiated onto the TMDC layer 34, a larger photoelectric conversion occurs than when there are no fine particles 42 present. As a result, the photoelectric efficiency is increased by the presence of the fine particles 42 on a surface of the P-type region 34p.

Next, a method of manufacturing an electronic device according to example embodiments will be described with reference to FIGS. 2 through 7. Like reference numerals are used to indicate elements that are substantially the same as elements described with reference to FIG. 1, and detailed descriptions thereof will not be repeated.

Figure 2:
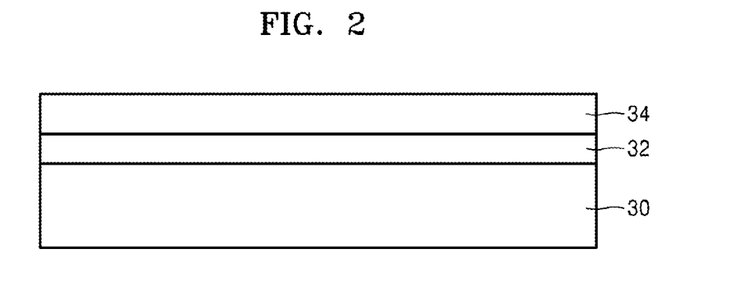
FIGS. 2 through 7 are cross-sectional views illustrating a method of manufacturing an electronic device that includes a horizontal type diode according to example embodiments.

Referring to FIG. 2, an insulating film 32 is formed on a substrate 30. A TMDC layer 34 is formed on the insulating film 32. The TMDC layer 34 inherently shows an N-type semiconductor characteristic.

Figure 3:
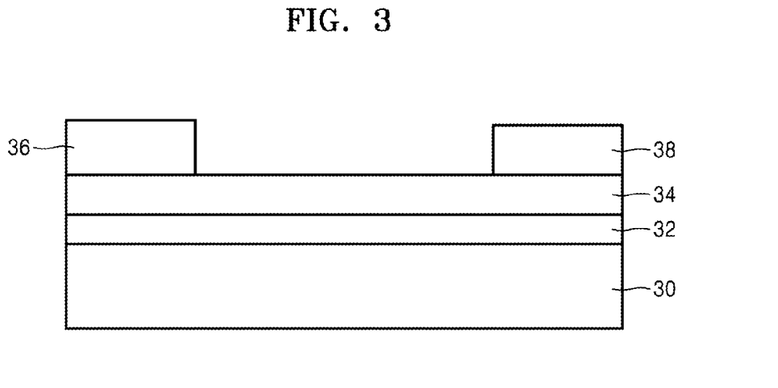
Figure 4:
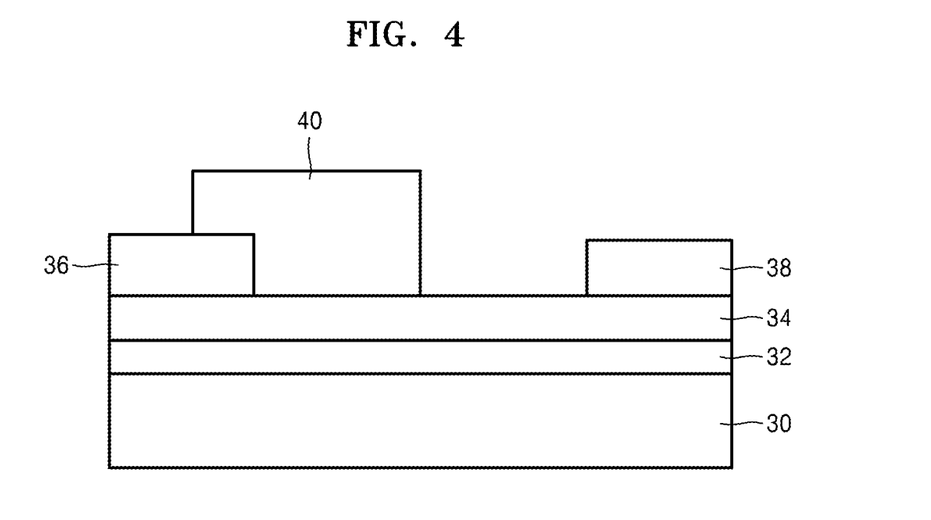

Referring to FIG. 3, first and second electrodes 36 and 38 are separately formed on the TMDC layer 34. Next, as depicted in FIG. 4, a mask layer 40 is formed on a portion of the TMDC layer 34. The mask layer 40 may also be a 2D material layer. The mask layer 40 may be formed to cover a portion of the first electrode 36. The mask layer 40 may be formed to cover a portion of the second electrode 38 instead of covering the portion of the first electrode 36. In this case, the mask layer 40 may be formed on a region of the TMDC layer 34 adjacent to the second electrode 38.

Figure 5:
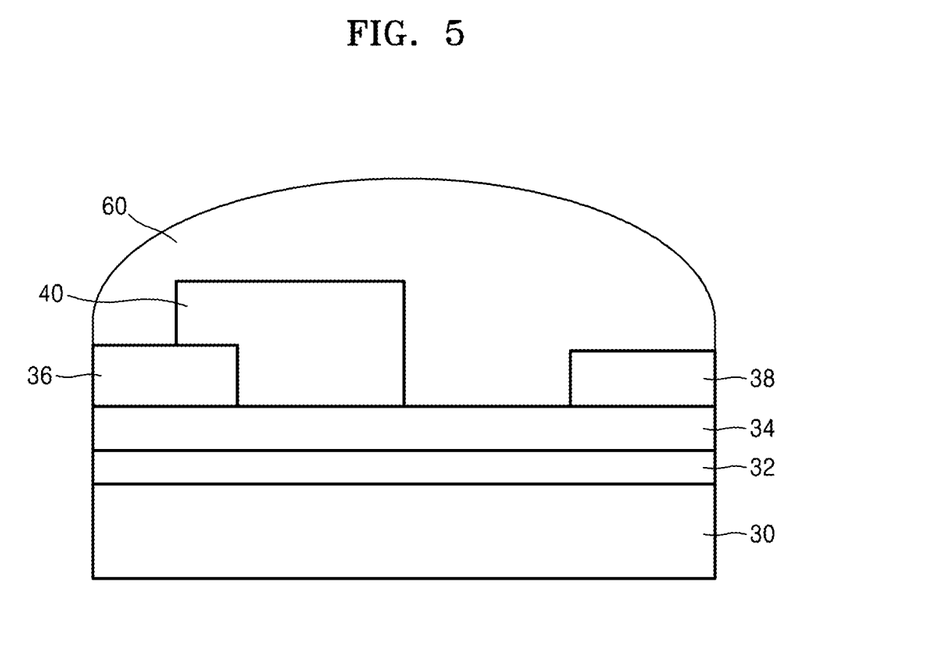

Next, referring to FIG. 5, a sol-gel layer 60 that covers the first and second electrodes 36 and 38 and the mask layer 40 is formed on the TMDC layer 34. The sol-gel layer 60 also covers the TMDC layer 34 between the mask layer 40 and the second electrode 38. The sol-gel layer 60 may include a material that changes a region of the TMDC layer 34 that contacts the sol-gel layer 60 to a P-type region. The sol-gel layer 60 may include, for example, $AuCl_3$, $HAuCl_4$, $AgNO_3$, or diazonium salt. The sol-gel layer 60 may be coated by a spin coating method. The sol-gel layer 60 is coated to cover the first and second electrodes 36 and 38 and the mask layer 40 that are present on the TMDC layer 34. However, the sol-gel layer 60 remains only on the TMDC layer 34 due to the chemical characteristic of the sol-gel layer 60, and the sol-gel layer 60 coated on the first and second electrodes 36 and 38 and the mask layer 40 is removed. That is, the sol-gel layer 60 is not well adhered to the first and second electrodes 36 and 38, the insulating film 32, and the mask layer 40 because the sol-gel layer 60 is hydrophobic to other members 32, 36, 38 and 40 besides the TMDC layer 34.

Figure 6:
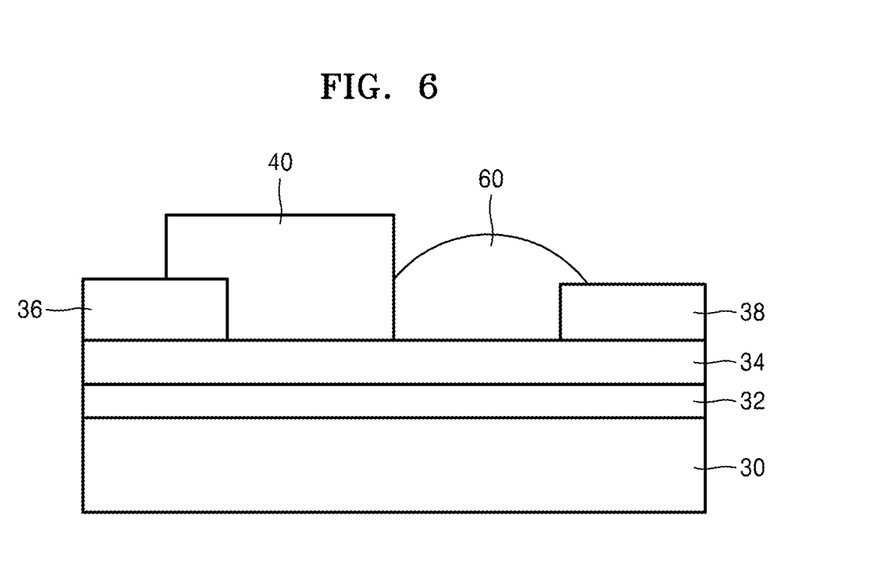
Figure 7:
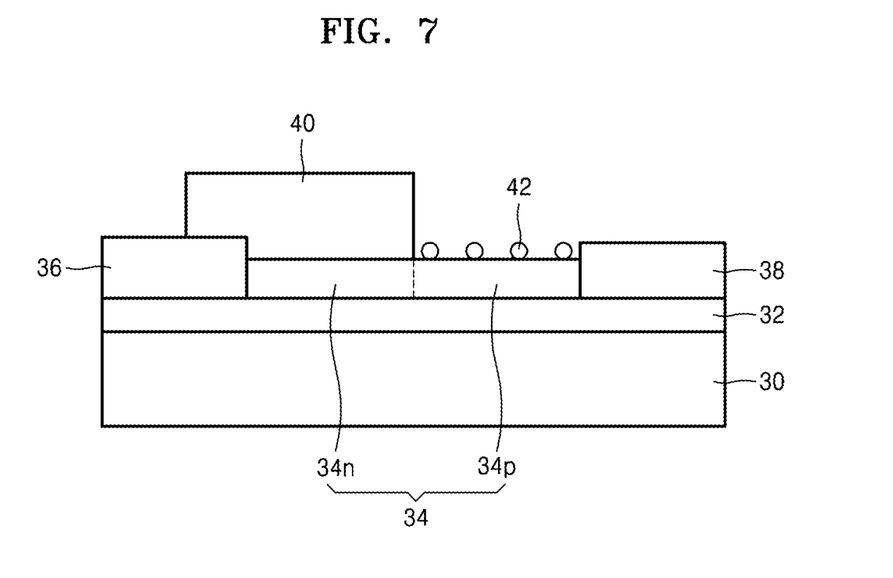

As depicted in FIG. 6, in this manner, the sol-gel layer 60 remains on the TMDC layer 34 between the mask layer 40 and the second electrode 38. A component (for example, Au) of the sol-gel layer 60 combine with electrons of the TMDC layer 34, and as a result, a portion of the TMDC layer 34 that contacts the sol-gel layer 60 has a deficiency of electrons, and thus, shows a characteristic like a P-type doping region. In this way, as depicted in FIG. 7, the TMDC layer 34 is divided into an N-type region 34n and a P-type region 34p. After the sol-gel layer 60 is coated, components of the sol-gel layer 60 are decomposed, and a component (for example, Au) that combines with electrons of the TMDC layer 34 remains on a surface of the TMDC layer 34 that contacts the sol-gel layer 60 and another component (for example, Cl) volatilizes. That is, after coating the sol-gel layer 60, a material included in the sol-gel layer 60, for example, $AuCl_3$ is decomposed into Cl and Au. Cl is removed as a gas state and Au remains as a solid state as time passes. Au atoms spontaneously form fine particles due to self-cohesiveness. The fine particles formed in this way are distributed on a surface of the TMDC layer 34.

As a result, as depicted in FIG. 7, fine particles 42 are distributed on the surface of the TMDC layer 34 between the mask layer 40 and the second electrode 38. The fine particles 42 act as a plasmonic nanostructure, thereby increasing photoelectric efficiency.

Figure 8:
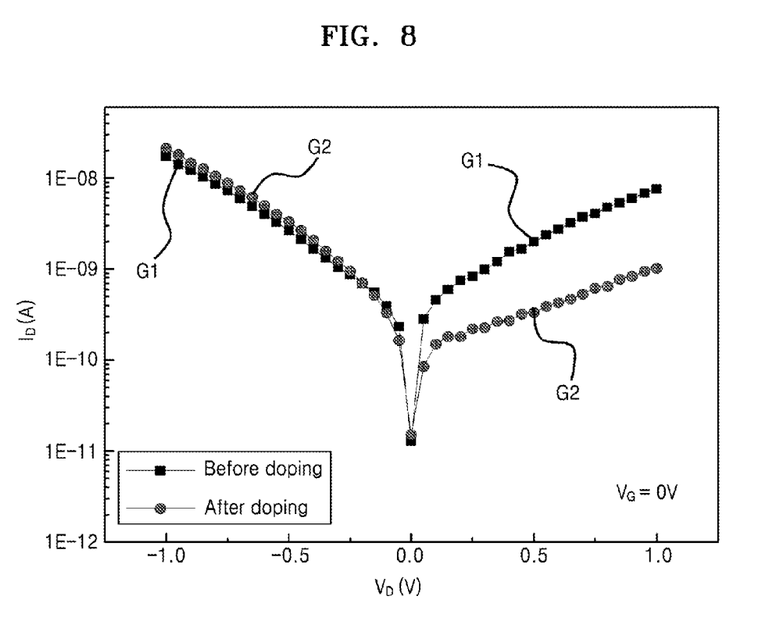
FIG. 8 is a graph showing an electrical characteristic of an electronic device that includes a horizontal type diode according to example embodiments.

FIG. 8 is a graph showing an electrical characteristic of the electronic device according to example embodiments. In an electronic device that is used to obtain the result of FIG. 8, $MoS_2$ is used as the TMDC layer 34 and $AuCl_3$ is used as the sol-gel layer 60. H-BN is used as the mask layer 40.

In FIG. 8, the horizontal axis indicates a voltage $V_D$ between the first and second electrodes 36 and 38, and the vertical axis indicates a current $I_D$ between the first and second electrodes 36 and 38. The current $I_D$ is a log scale. In FIG. 8, a first graph G1 shows values before forming the sol-gel layer 60, and a second graph shows values after forming the sol-gel layer 60.

Referring to FIG. 8, the electrical characteristic before forming the sol-gel layer 60 is symmetrical (first graph). However, the electrical characteristic after forming the sol-gel layer 60 is asymmetrical (second graph). This result is a rectifying characteristic exhibited by a common diode. Accordingly, the result shown in FIG. 8 implies the presence of a horizontal type p-n diode in the TMDC layer 34 of the electronic device according to example embodiments.

Figure 9:
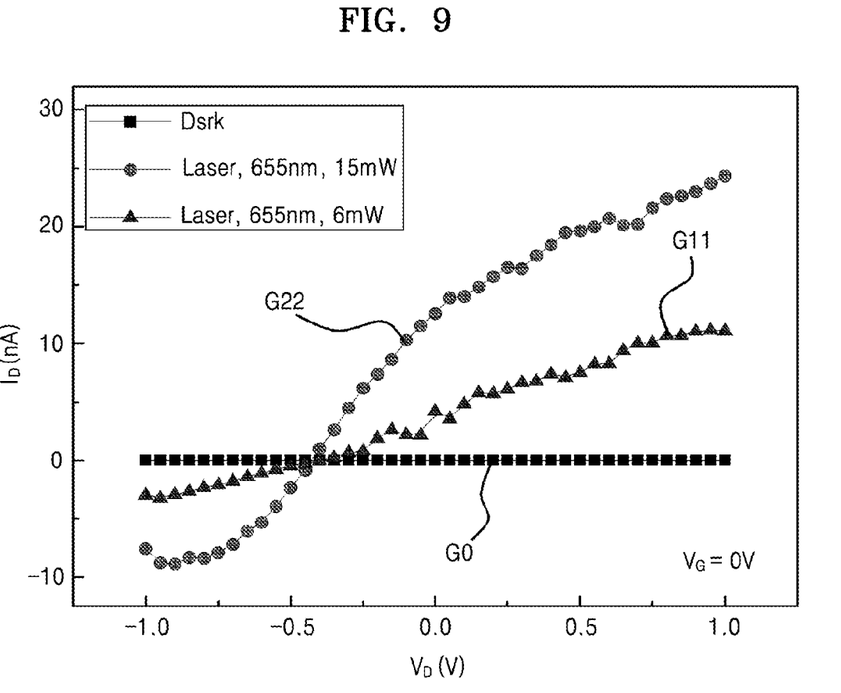
FIGS. 9 and 10 are graphs showing photoelectric characteristics of an electronic device that includes a horizontal type diode according to example embodiments.
Figure 10:
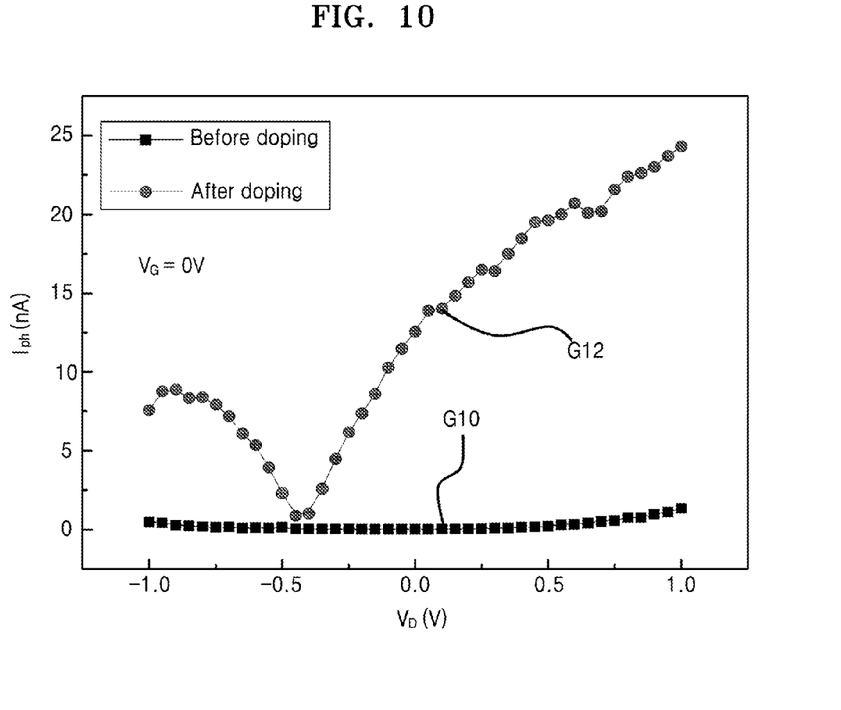

FIGS. 9 and 10 are graphs showing photoelectric characteristics of an electronic device according to example embodiments. An electronic device that is used to obtain the results of FIGS. 9 and 10 may be the same electronic device as that is used to obtain the result of FIG. 8.

The result of FIG. 9 was obtained by irradiating a laser having a wavelength of 655 nm to the electronic device in the presence of the sol-gel layer 60. In FIG. 9, the horizontal axis indicates a voltage $V_D$ between the first and second electrodes 36 and 38, and the vertical axis indicates a current $I_D$ between the first and second electrodes 36 and 38.

In FIG. 9, a first graph G11 shows a result when an output of the laser is 6 mW, and a second graph G22 shows a result when an output of the laser is 15 mW. A base graph G0 shows a result when no laser is irradiated.

Referring to FIG. 9, an opening circuit voltage of approximately 0.5 V is seen on the first and second graphs G11 and G22, and the opening circuit voltage shows an inherent characteristic of a p-n diode. In the electronic device, according to example embodiments, it may be seen that a p-n junction is well formed between the P-type region 34p and the N-type region 34n that are included in the TMDC layer 34 from the generation of the opening circuit voltage. Accordingly, the electronic device may be applied to a photoelectric device, such as a solar cell.

FIG. 10 is a graph showing the effect of the sol-gel layer 60 on an optical current. In FIG. 10, the horizontal axis indicates a voltage $V_D$ between the first and second electrodes 36 and 38, and the vertical axis indicates an optical current $I_{ph}$. In FIGS. 8 through 10, a gate voltage VG is maintained as 0 V.

In FIG. 10, a first graph G12 shows when the sol-gel layer 60 is present, and a base graph G10 shows when the sol-gel layer 60 is not present.

Referring to FIG. 10, the optical current increases when the sol-gel layer 60 is present (first graph G12) compared to when the sol-gel layer 60 is not present (the base graph G10). Also, although not shown in the drawing due to it not being clearly distinguished in a black-white state, the formation of fine Au particles are confirmed on a surface of the P-type region 34p of the TMDC layer 34 through an atomic force microscopy (AFM) measurement after coating the sol-gel layer 60 on the surface of the TMDC layer 34.

According to example embodiments, the electronic device includes a horizontal type diode formed of a 2D material layer, and fine metal particles are distributed on the P-type region of the horizontal type diode. The fine metal particles act as plasmonic nanostructures, and as a result, the photoelectric efficiency of the electronic device is increased.

While some example embodiments have been particularly shown and described, it will be understood by one of ordinary skill in the art that variations in form and detail may be made therein without departing from the spirit and scope of the claims.

What is claimed is:

1. An electronic device comprising:
    a substrate;
    an insulating film on the substrate;
    a diode layer on the insulating film,
        the diode layer including a two dimensional (2D) material layer comprising a monolayer crystalline material, and
        the 2D material layer including an N-type region and a P-type region that are arranged laterally to each other, and
        a thickness of the N-type region being equal to a thickness of the P-type region; and
    particles on the P-type region of the 2D material layer, wherein the particles include metal particles, and the metal particles are not arranged on the N-type region of the 2D material layer.

2. The electronic device of claim 1, further comprising: a mask layer on the N-type region.

3. The electronic device of claim 2, wherein
    the mask layer includes a 2D material comprising a monolayer crystalline material, and
    the 2D material in the mask layer is a hexagonal-boron nitride (h-BN) layer or a mica layer.

4. The electronic device of claim 1, wherein the metal particles configured to act as a plasmonic nanostructure.

5. The electronic device of claim 1, wherein the diode layer includes a transition metal dichalcogenide (TMDC) layer.

6. The electronic device of claim 1, wherein electrodes are respectively formed on the N-type region and the P-type region.

7. A method of manufacturing an electronic device, the method comprising:
    forming an insulating film on a substrate;
    forming a 2D material layer comprising a monolayer crystalline material on the insulating film; and
    dividing the 2D material layer into an N-type region and a P-type region, the dividing the 2D material layer into the N-type region and the P-type region including,
        forming first and second electrodes on the 2D material layer, the first and second electrode being separated from each other, and
        transforming a portion of the 2D material layer between the first and second electrodes into the P-type region, the transforming the portion of the 2D material layer including,
            covering a region corresponding to the N-type region of the 2D material layer with a mask layer, and
            covering a region corresponding to the P-type region of the 2D material layer with a sol-gel layer.

8. The method claim 7, wherein the 2D material layer includes a transition metal dichalcogenide (TMDC) layer.

9. The method claim 7, wherein the covering the region corresponding to the P-type region with the sol-gel layer includes:
    coating the sol-gel layer on the 2D material layer to cover the first electrode, second electrode, and mask layer, on the 2D material layer; and
    removing the sol-gel layer except for a portion of the sol-gel layer covering the region corresponding to the P-type region.

10. The method claim 7, wherein
    the mask layer includes a 2D material comprising a monolayer crystalline material, and
    the 2D material is a non-conductive material layer having a band gap of 5 eV or more.

11. The method claim 7, wherein the mask layer includes an h-BN layer or a mica layer.

12. The method claim 7, wherein the sol-gel layer includes a component that combines with electrons in the 2D material layer.

13. The method claim 12, wherein the component includes Au.

14. A method of manufacturing an electronic device, the method comprising:
    forming an insulating film on a substrate;
    forming a 2D material layer comprising a monolayer crystalline material on the insulating film, the 2D material layer having an N-type characteristic; and
    forming a P-type region in a part of the 2D material layer by forming particles on a top surface of the 2D material layer, a remaining part of the 2D material layer being an N-type region,
    wherein the N-type region and the P-type region are in contact with the insulating film.

15. The method of claim 14, wherein the forming the P-type region includes:
    forming first and second electrodes on the 2D material layer, the first and second electrode being separated from each other; and
    transforming a portion of the 2D material layer between the first and second electrodes into the P-type region.

16. The method of claim 14, wherein
the forming the P-type region includes forming metal particles on the part of the 2D material layer, and
the metal particles are not formed on the N-type region.

17. The method of claim 14, wherein a thickness of the P-type region is equal to a thickness of the N-type region.

* * * * *